United States Patent [19]

Kawasaki

[11] Patent Number: 5,777,526
[45] Date of Patent: Jul. 7, 1998

[54] METHOD OF MANUFACTURING A MICROSTRIP TRANSMISSION DEVICE

[75] Inventor: Kazuhiro Kawasaki, Yokohama, Japan

[73] Assignee: Hitachi, Ltd., Tokyo, Japan

[21] Appl. No.: 831,774

[22] Filed: Apr. 2, 1997

Related U.S. Application Data

[63] Continuation of Ser. No. 520,745, Aug. 29, 1995, abandoned.

[30] Foreign Application Priority Data

Sep. 1, 1994 [JP] Japan .................................. 6-208874

[51] Int. Cl.⁶ .................................. H01P 3/08; H01P 5/00
[52] U.S. Cl. .................................. 333/1; 333/33; 333/161; 333/238
[58] Field of Search .................................. 333/1, 33, 161, 333/34, 238, 246, 160

[56] References Cited

U.S. PATENT DOCUMENTS

| | | | |
|---|---|---|---|
| 2,754,484 | 7/1956 | Adams ........................... | 333/246 X |
| 3,634,789 | 1/1972 | Stuckert ........................ | 333/34 X |
| 4,513,266 | 4/1985 | Ishihara ........................ | 333/246 X |
| 5,184,095 | 2/1993 | Hanz et al. .................... | 333/238 X |
| 5,270,672 | 12/1993 | Schinzel ....................... | 333/246 |
| 5,426,399 | 6/1995 | Matsubayashi et al. ............ | 333/1 |
| 5,519,363 | 5/1996 | Boudreau et al. ................ | 333/1 |

FOREIGN PATENT DOCUMENTS

| | | | |
|---|---|---|---|
| 35202 | 2/1992 | Japan .................................. | 333/246 |
| 351102 | 12/1992 | Japan .................................. | 333/238 |
| 5-243804 | 9/1993 | Japan . | |

OTHER PUBLICATIONS

Laverghetta, *Microwave Materials: The Choice Is Critical*, Microwave Journal, Sep. 1985, pp. 163–173.

Gupta, *Microwaves*, Hatsted Press Book, John Wiley & Sons, N.Y., 1981, Title page & pp. 198–201 Cited "Transmission Line Design Handbook", by Brian C. Wadell, 1001, pp. 93–111, Artech House, Norwood, MA, 1991.

*Primary Examiner*—Paul Gensler
*Attorney, Agent, or Firm*—Fay, Sharpe, Beall, Fagan, Minnich & McKee

[57] ABSTRACT

A microstrip transmission line device wherein if there is a difference between absolute transmission delay times tpd of two signals to be transmitted over two strip conductors, for example, if a clock signal for tpd=83.3 or 76.9 ps/cm and a data signal for tpd=63.3 or 56.9 ps/cm are to be transmitted, a transmission delay time tpd per unit length of one strip conductor is adjusted by disposing a dielectric just under the one strip conductor, the dielectric having a predetermined relative dielectric constant (in this case, εr=5.0 or 4.0) different from a relative dielectric constant (in this case, εr=9.0 or 8.0) of a dielectric just under another strip conductor by an amount corresponding to a difference between absolute transmission delay times tpd of the one strip conductor and the other strip conductor. In this manner, the lengths of the two strip lines are made equal.

2 Claims, 13 Drawing Sheets

- 23 DIELECTRIC
- 21 STRIP CONDUCTOR
- 22 STRIP CONDUCTOR
- 24 DIELECTRIC SUBSTANCE
- CLOCK  DATA

W=0.66mm
$\varepsilon r=9.0$
tpd=83.3 ps/cm

W=0.66mm
$\varepsilon r=5.0$
tpd=63.3 ps/cm
d=0.635mm

25 GROUND PLANE CONDUCTOR

CLOCK  DATA

W=0.66mm
$\varepsilon r=8.0$
tpd=76.9 ps/cm

W=0.66mm
$\varepsilon r=4.0$
tpd=56.9 ps/cm
d=0.635mm

AREA OF GROUND PLANE = 8cm X 12cm $\varepsilon r = 9.0$
$tpd = 83.3 \, ps/cm$
$d' = 0.381 mm$ $\varepsilon r = 9.0$
$tpd = 83.3 \, ps/cm$
$d' = 0.381 mm$

METHOD OF MANUFACTURING A MICROSTRIP TRANSMISSION DEVICE

This is a continuation application of Ser. No. 08/520,745, filed Aug. 29, 1995, now abandoned.

BACKGROUND OF THE INVENTION

1. Field of the Invention

The present invention relates to a microstrip transmission line device, a method of manufacturing the same, and a microstrip transmission line module with digital circuit elements. More particularly, the present invention relates to such a device, method, and module suitable for the transmission of digital signals at high speed while ensuring high precision transmission timings.

2. Description of the Related Art

The fundamental structure of a conventional microstrip transmission line device is a laminate of a strip conductor layer, a flat dielectric substrate, and a ground plane conductor, stacked in this order from the top. This structure is described, for example, in "Transmission Line Design Handbook", by Brian C. Wadell, 1991, at pp. 93–111, published by Artech House.

Although different from the technical field of a microstrip transmission line device, a flat plane antenna has been proposed in JP-A-5-243804 wherein a phase difference is established even between strip conductors having the same length, by partially changing the dielectric constant of a dielectric on a ground plane conductor so as to change a signal transmission speed over the strip conductor.

SUMMARY OF THE INVENTION

Signal transfer between high speed digital circuits requires a timing design which ensures correct absolute transmission delay times of signals. For example, the width of a data signal of 2.4 Gb/s is as small as about 400 ps (pico seconds). If a dielectric substance having a relative dielectric constant $\epsilon_r$ of 7.0 is used, the transmission delay time is about 88 ps/cm. Therefore, a microstrip transmission line length difference of several cm may cause a failure of data input to a flop-flop circuit at the succeeding stage. It is essential to set correct absolute transmission delay times of microstrip transmission lines so as to satisfy the timing specifications of high speed digital circuits.

If there are a number of signals to be transmitted and a large difference between absolute transmission delay times necessary for respective microstrip transmission lines, short and long microstrip transmission lines are mixed in one microstrip transmission line device. In this case, it becomes difficult to pattern strip conductors interconnecting high speed digital circuits on the device.

Mixture of long and short strip conductors necessitates alternate routes. In this case, the area of the device increases. Furthermore, a narrow gap between adjacent microstrip transmission lines among a number of congested lines, poses a problem of crosstalk.

If the absolute transmission delay times of microstrip transmission lines of a microstrip transmission line module are preset by the specifications, there is no degree of freedom in the length of each microstrip transmission line. This poses another problem that the area of the microstrip transmission line device cannot be reduced.

If a conventional microstrip transmission line device is once manufactured, it is practically impossible to change the length of each microstrip line. In order to change the length, it is necessary to manufacture a new microstrip transmission line device. A problem of cost therefore arises.

It is therefore a primary object of the invention to solve the above-described conventional problems.

It is a first object of the present invention to provide an improved microstrip transmission line device capable of reducing a difference between strip line lengths as much as possible, even if signals are to be transmitted between circuit elements via a plurality of strip lines having different transmission delay times.

It is a second object of the present invention to provide an improved microstrip transmission line device capable of matching the characteristic impedances of microstrip transmission lines.

It is a third object of the present invention to provide an improved microstrip transmission line device capable of solving a problem of crosstalk between nearby microstrip transmission lines.

It is a fourth object of the present invention to provide a method of manufacturing a microstrip transmission line device with simple processes.

It is a fifth object of the present invention to provide a microstrip transmission line module having a plurality of high speed digital circuit elements interconnected by microstrip transmission lines of a microstrip transmission line device.

In order to achieve the first object of the invention (hereinafter called a first invention), a microstrip transmission line device is provided which comprises:

at least a dielectric substrate formed on a ground plane conductor and a plurality of strip conductors juxtaposed on a flat surface of the dielectric substrate; and means for adjusting, if there are differences between absolute transmission delay times of signals to be transmitted over the strip conductors, a transmission delay time per unit length of one strip conductor by disposing a dielectric just under the one strip conductor, the dielectric having a predetermined relative dielectric constant different from a relative dielectric constant of a dielectric just under another strip conductor by an amount corresponding to a difference between absolute transmission delay times of the one strip conductor and the other strip conductor.

More specifically, consider the case wherein a microstrip transmission line device has a strip conductor having a longer length than another strip conductor, i.e., a strip conductor having a large absolute value of a transmission delay time, and it is necessary to shorten the length of the longer strip conductor while ensuring a designed absolute transmission delay time. In this case, a dielectric just under the longer strip conductor having a larger dielectric constant than a dielectric just under the shorter strip conductor is used to substantially prolong the transmission delay time per unit length and realize the designed transmission delay time by a relatively short strip conductor.

Conversely, consider the case that a microstrip transmission line device requires a strip conductor having a shorter length than another strip conductor, i.e., a strip conductor having a small absolute value of a transmission delay time, and it is necessary to elongate the length of the shorter strip conductor while ensuring the designed absolute transmission delay time. In this case, a dielectric just under the shorter strip conductor having a smaller dielectric constant than a dielectric just under the longer strip conductor is used to substantially shorten the transmission delay time per unit length and realize the designed transmission delay time by a relatively long strip conductor.

An optional microstrip transmission line of a microstrip transmission line device of this invention may be detachably replaced with an already mounted microstrip transmission line, by preparing a microstrip transmission line component (including a strip conductor and a dielectric having a dielectric constant satisfying a particular specification).

In connecting microstrip transmission lines of a microstrip transmission line device made of dielectrics having different dielectric constants, or in connecting a microstrip line and a circuit element, it is practically preferable to match the characteristic impedances of microstrip lines with one another and match the characteristic impedance of a microstrip line with an input/output impedance of a circuit element.

The second object of the invention (hereinafter called a second invention) aims at solving such a matching problem. The characteristic impedances of microstrip lines made of dielectrics having different dielectric constants can be adjusted with each other by one of the following three adjusting means. First means adjusts the characteristic impedance of each microstrip line by setting a distance d between the strip conductor and ground plane conductor to a redetermined value. Second means adjusts the characteristic impedance of each microstrip line by setting the width w of the strip conductor to a predetermined value. Third means adjusts the characteristic impedance of each microstrip transmission line by a combination of the first and second means, i.e., by setting both the distance d between the strip conductor and ground plane conductor and width w of the strip conductor to predetermined values.

As the number of microstrip transmission lines of a microstrip transmission line device increases and are congested, gaps between adjacent microstrip transmission lines become narrow. This poses a problem of crosstalk between adjacent microstrip transmission lines. The third object of the invention (hereinafter called a third invention) solves this problem by inserting a conductive layer between dielectrics just under strip conductors having different dielectric constants to reduce an amount of crosstalk.

In order to achieve the fourth embodiment of the invention (hereinafter called a fourth invention), a method of manufacturing a microstrip transmission line device is provided which comprises the steps of:

forming a dielectric substrate comprising dielectrics having different dielectric constants selected in accordance with a specification of transmission delay times, and disposed at areas where microstrip transmission lines are formed, the dielectric substrate having at least one flat surface;

forming a conductor layer on both surfaces of the dielectric substrate, the conductor layer on one surface of the dielectric substrate being used as a ground plane conductor;

patterning the conductor layer on the flat surface through photolithography or other processes to form each strip conductor having a predetermined width at each area corresponding to each dielectric.

The step of forming a dielectric substrate comprising dielectrics having different dielectric constants selected in accordance with a specification of transmission delay times, and disposed at areas corresponding to strip conductors, the dielectric substrate having at least one flat surface, may be replaced by the step of forming a dielectric substrate of a same dielectric, and selectively doping impurity elements by a known method such as thermal diffusion and ion implantation, into the dielectric substrate at areas where strip conductors having predetermined widths are formed, to thereby partially change the relative dielectric constants of the dielectric substrate.

The fifth object of the invention (hereinafter called a fifth invention) is achieved by a microstrip transmission line module having a plurality of high speed digital circuit elements formed on a microstrip transmission line device and interconnected by a plurality of microstrip transmission lines.

Specifically, a compact microstrip transmission line module can be realized by using a microstrip transmission line device of the first invention featured in the ability to shorten strip conductors and reduce the size of the device. A microstrip transmission line module with a high efficiency can be realized by using a microstrip transmission line device of the second invention featured in the ability of matching the characteristic impedances of microstrip transmission lines. A microstrip transmission line module with a reduced crosstalk can be realized by using a microstrip transmission line device of the third invention.

DETAILED DESCRIPTION OF THE PREFERRED EMBODIMENTS

The principle of a microstrip transmission line device of this invention will be described with reference to FIGS. 1 to 4, the device being applied to a circuit board for a digital signal multiplexer and demultiplexer of a ultra high speed optical communication system.

Figure 1:
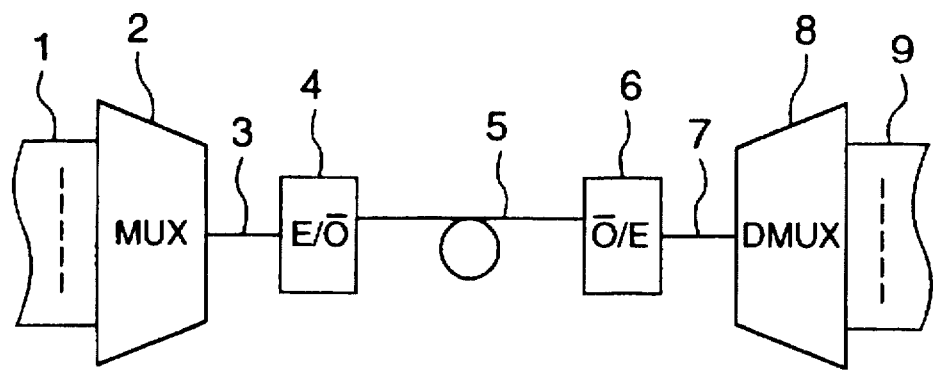
FIG. 1 is a schematic diagram showing the structure of a ultra high speed optical communication system.

FIG. 1 is a schematic diagram showing the structure of a ultra high speed optical communication system. With this system, a number of input signals 1 are multiplexed by a digital signal multiplexer 2. The multiplexed signal 3 is converted from an electrical signal into an optical signal by an electrical-optical converter 4. The multiplexed optical signal is transmitted over an optical fiber 5. The multiplexed optical signal received by an optical-electrical converter 6 is converted from an optical signal into an electrical signal. The multiplexed signal 7 is then demultiplexed by a digital signal demultiplexer 8 into a number of output signals 9.

Several tens Gb/s can be realized as the transmission speed of an output signal from the digital multiplexer 2 and an input signal to the digital demultiplexer 8. In such a case, the numbers of input signals 1 and output signals 9 of 600 Mb/s are several tens or more. It is necessary to lay out and interconnect high speed digital circuit elements so as to satisfy the timing specifications.

Figure 2:
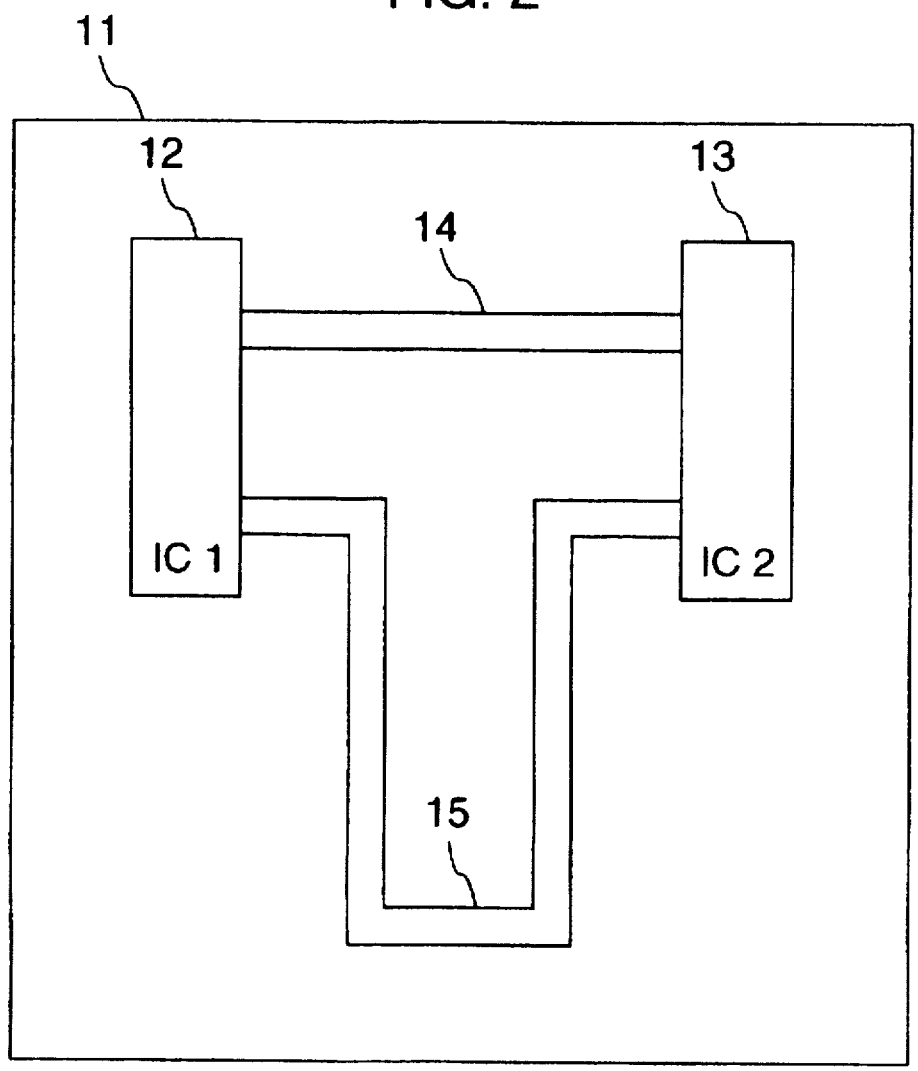
FIG. 2 is a plan view showing a conventional microstrip transmission line module having high speed digital circuit elements interconnected by strip conductors.

FIG. 2 is a plan view showing a comparison example of a conventional microstrip transmission line device. In this example, high speed digital circuit elements (integrated circuit elements) 12 and 13 disposed on a microstrip transmission line device 11 are electrically connected by microstrip transmission lines 14 and 15. There is a large length difference between the two microstrip transmission lines 14 and 15 because there is a large difference of absolute transmission delay times of the two lines 14 and 15. Although the two lines 14 and 15 can be patterned as shown in FIG. 2, the area of the microstrip transmission line device increases.

An increased area becomes manifest when compared to the area of a microstrip transmission line device 112 of the invention to be described later and shown in FIG. 3 in which the strip conductors of microstrip transmission lines 142 and 152 interconnecting high speed digital circuit elements 122 and 132 disposed on the device 112 have the same length.

Another problem is a layout difficulty of a number of short and long strip conductors interconnecting high speed digital circuit elements, as in the case shown in FIG. 2 wherein there is a large difference between the lengths of short and long strip conductors.

Figure 3:
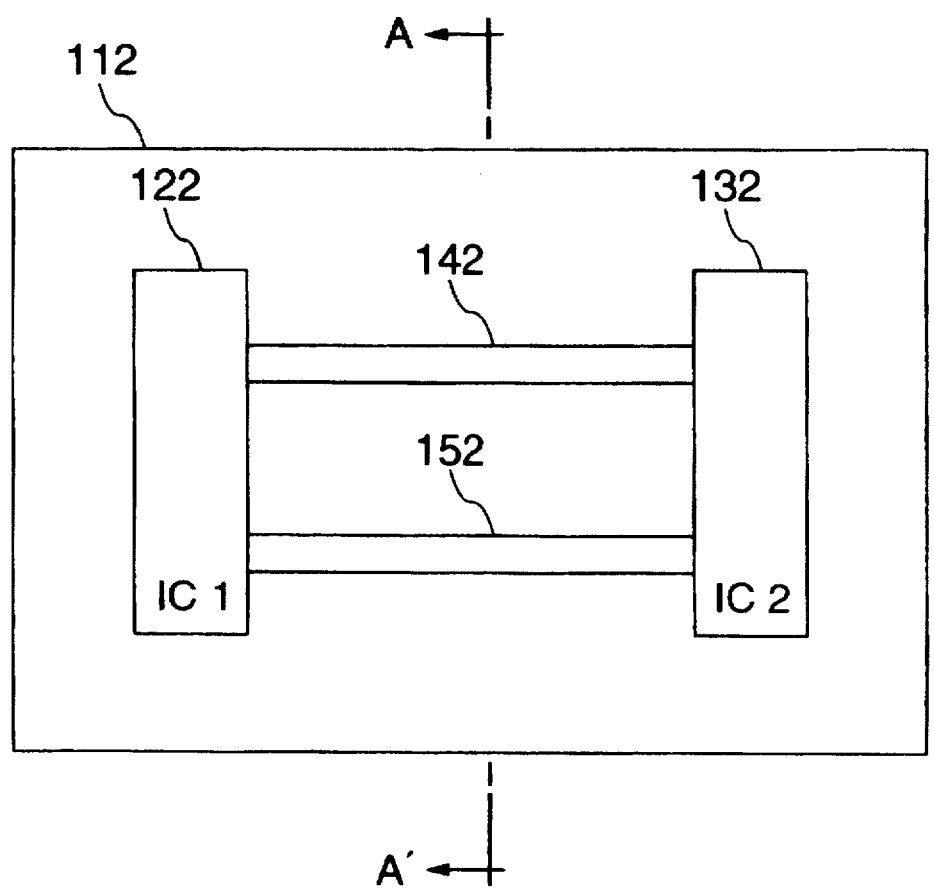
FIG. 3 is a plan view showing a microstrip transmission line module having high speed digital circuit elements interconnected by strip conductors, according to the invention, and illustrating the principle of the invention.

FIG. 3 is a plan view showing an example of a microstrip transmission line device according to the first invention. The high speed digital circuit elements (integrated circuit elements) 122 and 132 disposed on the device 112 are interconnected by the microstrip transmission lines 142 and 152 of the same length.

Figure 4A:
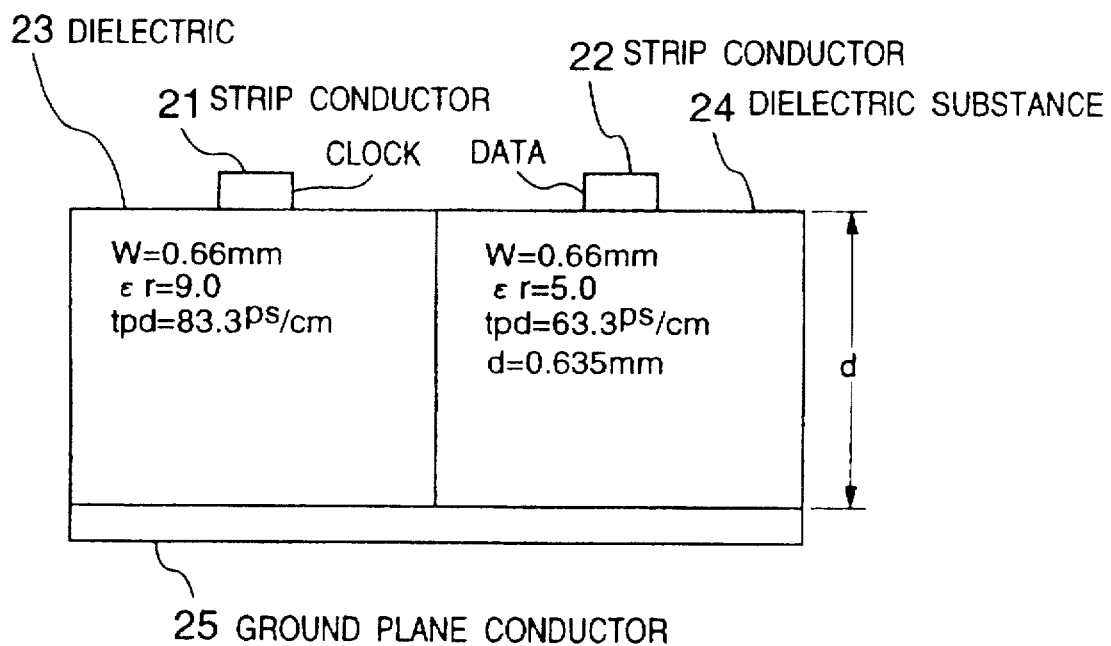
FIGS. 4A and 4B are cross sectional views showing a microstrip transmission line device according to a first embodiment of the invention, and its application, and illustrating the principle of the invention.
Figure 4B:
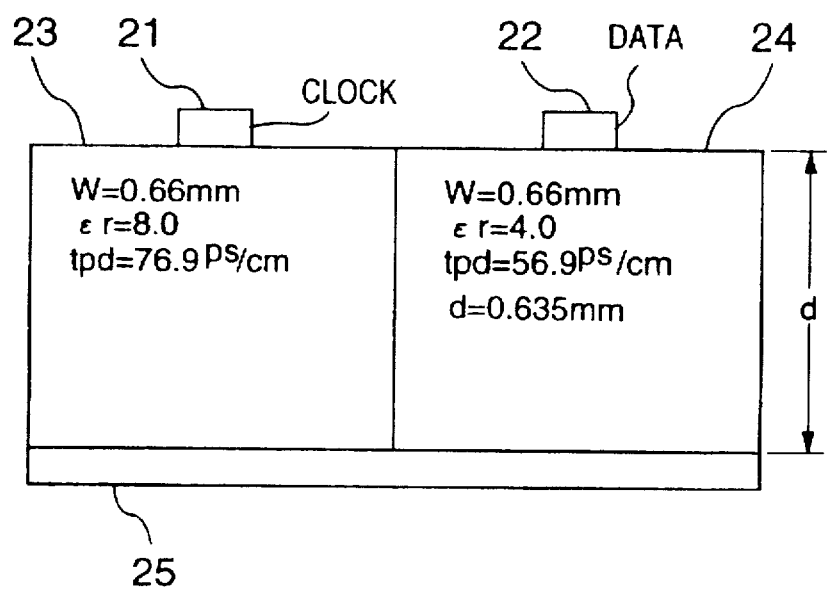

FIGS. 4A and 4B are a cross sectional view taken along line A-A' of FIG. 3. The microstrip transmission lines 142 and 152 shown in FIG. 3 are constituted by respective strip conductors 21 and 22 having the same width w. respective dielectrics 23 and 24 having different relative dielectric constants $\epsilon r$, and a ground plane conductor 25.

It is generally known that a delay time tpd of a microstrip transmission line per unit length is proportional to a relative dielectric constant $\epsilon r$ of a dielectric, as given by the equation (1). It is seen from this equation that as the relative dielectric constant $\epsilon r$ of a dielectric becomes large, the delay time tpd per unit length becomes large correspondingly. C in the equation (1) represents a light speed.

$$tpd = \sqrt{\epsilon r}/C \quad (1)$$

A relative dielectric constant $\epsilon r$ is related to a dielectric constant $\epsilon$ by the following equation (2). $\epsilon_0$ in the equation (2) represents a dielectric constant in vacuum.

$$\epsilon = \epsilon_0 \epsilon r \quad (2)$$

Therefore, if the absolute delay time necessary for the strip conductor 21 constituting the microstrip transmission line is longer than that necessary for the strip conductor 22 and if it is required to reduce a difference between strip conductor lengths, then the relative dielectric constant $\epsilon r$ of the dielectric 23 between the strip conductor 21 and ground plane conductor 25 is set larger than that of the dielectric 24 between the strip conductor 22 and ground plane conductor 25. In this manner, the absolute delay times necessary for the strip conductors 21 and 22 of the microstrip transmission lines are satisfied and the difference between these strip conductor lengths can be made small.

Conversely, if the absolute delay time necessary for the strip conductor 21 of the microstrip transmission line is shorter than that necessary for the strip conductor 22 and if it is required to reduce a difference between strip conductor lengths, then the relative dielectric constant $\epsilon r$ of the dielectric 23 between the strip conductor 21 and ground plane conductor 25 is set smaller than that of the dielectric 24 between the strip conductor 22 and ground plane conductor 25. In this manner, the absolute delay times necessary for the strip conductors 21 and 22 of the microstrip transmission lines are satisfied and the difference between these strip conductor lengths can be made small.

There are various dielectrics. Of these, typical ones are polytetrafluoroethylene (2.4), glass epoxy (4.4–5.0), alumina composite (5.0–10.0), and alumina ceramic (9.0–10.0). Values in parentheses are relative dielectric constants (representative values) $\epsilon r$. The dielectric constant can therefore be set to a desired value in a relatively wide range. The strip conductors 21 and 22 and ground plane conductor 25 may be a copper layer or a nickel layer which can be easily formed by known techniques such as plating, sputtering, and evaporation.

An optional microstrip transmission line of a microstrip transmission line device of the first invention may be detachably replaced with an already mounted microstrip transmission line on the ground plane conductor, by preparing a microstrip transmission line component having a delay time satisfying the specification. In this case, a delay time error caused by a dispersion in the characteristics of digital circuit elements mounted on the microstrip transmission line device or by a design error, can be corrected by replacing the microstrip transmission line component, without newly designing or manufacturing the device.

Next, the characteristic impedance adjusting means of the second invention will be described. In FIGS. 4A and 4B, in order to reduce a difference between strip conductor lengths, the relative dielectric constant $\varepsilon r$ of the dielectric 23 between the strip conductor 21 and ground plane substrate 25 is made to be different from the relative dielectric constant $\varepsilon r$ of the dielectric 24 between the strip conductor 22 and ground plane substrate 25. Therefore, the characteristic impedances of these microstrip transmission lines are different. This becomes manifest from that the characteristic impedance $Z_0$ of a microstrip transmission line is inversely proportional to the dielectric constant $\varepsilon r$, as given in the following equation (3). In this equation (3), $\mu$ represents a permeability, W represents a width of a strip conductor, and d represents a distance between a strip conductor and a ground plane conductor (corresponding to a thickness of a dielectric substance).

$$Z_0 = d/W \times \sqrt{(\mu/\varepsilon)} \quad (3)$$

It can be seen from the equation (3) that the characteristic impedance $Z_0$ of a microstrip transmission line is proportional to the distance d between the strip conductor and ground plane conductor and changes with a ratio of the width W of the strip conductor to the distance d between the strip conductor and ground plane conductor. The second invention therefore further improves the first invention and enables characteristic impedance matching of microstrip transmission lines, by adjusting the width W of the strip conductor, the distance d between the strip conductor and ground plane conductor, or both of them.

Next, reducing crosstalk of the third invention will be described. If the number of microstrip transmission lines is large and a sufficient gap between nearby strip conductors is not possible because of congested strip conductors, crosstalk may be generated. In order to reduce a crosstalk amount, a conductor layer is inserted between adjacent different dielectrics just under strip conductors of a plurality of microstrip transmission lines, and the conductor layer is electrically connected to the ground plane conductor. The conductor layer inserted between dielectrics reduces a crosstalk amount by its electromagnetic shielding, and suppresses a malfunction of a circuit element.

In the manufacturing step of the fourth invention, the dielectric substrate is formed which comprises dielectrics having different dielectric constants selected in accordance with a specification of transmission delay times, and disposed at areas corresponding to strip conductors, the dielectric substrate having at least one flat surface. In this step, in joining the side walls of adjacent dielectrics or in adhering a dielectric to the ground plane conductor, generally used adhesive agent may be used. However, preferably, conductive adhesive such as solder paste is used. In this case, the conductive adhesive functions both as a bonding material and a conductor layer inserted between dielectrics of the third invention (functioning to reduce crosstalk).

In a microstrip transmission line module of the fifth invention, the relative dielectric constant $\varepsilon r$ of a dielectric just under a strip conductor is changed to shorten the length of the microstrip transmission line, if the absolute transmission delay times of microstrip transmission lines of a microstrip transmission line module are preset by the specifications and there is no degree of freedom in the length of each microstrip transmission line. In this manner, the length of each microstrip transmission line between digital circuit elements can be shortened. Accordingly, the size of the microstrip transmission line module with digital circuit elements can be made small.

Embodiments of the invention will be described with reference to the accompanying drawings, taking as an example a circuit board for a digital signal multiplexer and demultiplexer of a ultra high speed optical communication system which is a suitable example to which the microstrip transmission line device of this invention is applied. A method of manufacturing a microstrip transmission line device, and examples of a microstrip transmission line module with digital circuit elements will also be described.

|1st Embodiment|

FIG. 3 is a plan view showing a microstrip transmission line module in which high speed digital circuit elements (integrated circuits) 122 and 132 are mounted on a microstrip transmission line device 112, the circuit elements being interconnected by two microstrip transmission lines 142 and 152. FIGS. 4A and 4B are cross sectional views of microstrip transmission line devices taken along line A-A' of FIG. 3, showing the main parts of microstrip transmission lines 142 and 152.

The structure of a microstrip transmission line device, a method of manufacturing the same, and the performance test results will be described with reference to FIGS. 4A and 4B. FIG. 4A shows an example of the main structure of a microstrip transmission line device, and FIG. 4B shows another example thereof.

(1) Structure of Microstrip Transmission Line Device

Figure 18:
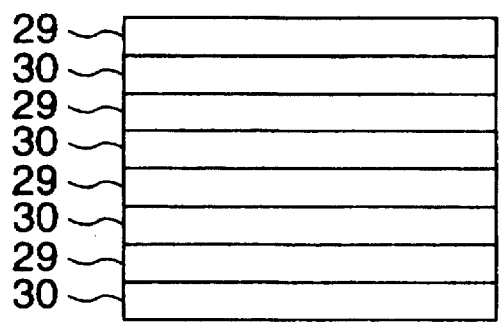
FIG. 18 is a cross sectional view showing an example of the dielectric substrate of the microstrip transmission line device of the first embodiment, and illustrating the principle of the invention.
Figure 19:
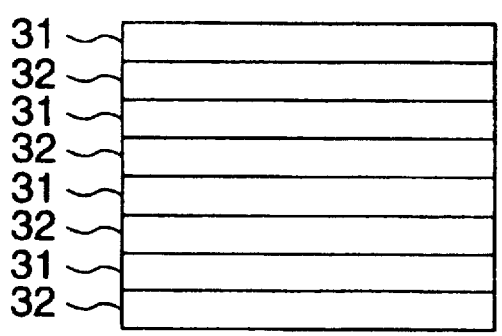
FIG. 19 is a cross sectional view showing another example of the dielectric substrate of the microstrip transmission line device of the first embodiment, and illustrating the principle of the invention.

As shown, the microstrip transmission line device is constituted by strip conductors 21 and 22, dielectrics 23 and 24, and a ground plane conductor 25. The strip conductors 21 and 22 are made of copper foil of 18 µm thickness, 0.66 mm width, and 3 cm length. In FIG. 4A, the dielectrics 23 and 24 are both made of alumina composite dielectrics and have a thickness of 0.635 mm. The dielectric 23 has a dielectric constant $\varepsilon r$ of 9.0, and the dielectric 24 has a dielectric constant $\varepsilon r$ of 5.0. In FIG. 4B, the dielectric 23 is, as shown in FIG. 18, a laminate of alumina composite dielectric substances 29 each having a thickness of 0.0794 mm and a relative dielectric constant $\varepsilon r$ of 9.0 and alumina composite dielectrics 30 each having a thickness of 0.0794 mm and a relative dielectric constant $\varepsilon r$ of 5.0. The total relative dielectric constant changes with a combination of respective relative dielectric constants of the dielectrics, which has been confirmed experimentally. In this case, the total relative dielectric constant is about 8.0. The dielectric 24 is, as shown in FIG. 19, a laminate of alumina composite dielectrics 32 each having a thickness of 0.0.794 mm and a relative dielectric constant $\varepsilon r$ of 5.0 and alumina composite dielectrics 33 each having a thickness of 0.0794 mm and a relative dielectric constant $\varepsilon r$ of 2.0. In this case, the total relative dielectric constant is about 4.0. The thickness of the dielectrics 23 and 24 is 0.635 mm.

(2) Manufacturing Method

The side walls of the alumina composite dielectric 23 with the relative dielectric constant $\varepsilon r$ of 9.0 and the alumina composite dielectric 24 with the relative dielectric constant of $\varepsilon r$ of 5.0 are joined together by adhesive to form an integrated dielectric substrate. Copper foil of 18 µm thick is rolled and attached to both the surfaces of the integrated dielectric substrate. The bottom surface copper foil is used as the ground plane conductor 25. A photoresist film is deposited on the top layer copper foil. By using a mask formed with a strip conductor pattern (strip line pattern of 0.66 mm wide and 3 cm long), the photoresist film is exposed and developed to form a resist pattern. By using this resist pattern as an etching mask, the exposed copper foil is selectively etched to leave a strip conductor pattern. Instead of rolling and attaching copper foil on both the surfaces of the dielectric substrate, plating catalyzer such as palladium may be coated on the dielectric substrate to perform electroless copper plating. If a thicker conductor layer is required, electrolytic plating may be performed by using the copper layer formed by electroless plating as the underlying layer.

(3) Performance Test Results

A signal to be transmitted over the strip conductor 21 is a clock signal requiring, for example, tpd=83.3 ps/cm or 76.9 ps/cm. A signal to be transmitted over the strip conductor 22 is a data signal requiring, for example, tpd=63.3 ps/cm or 56.9 ps/cm. In this embodiment, the lengths of the strip conductors 21 and 22 are both 3 cm, the time duration of the data signal and the period of the clock signal are 120 ps. The rise timings of the data signal inputted to the strip conductor 22 and the clock signal inputted to the strip conductor 21 are the same.

In order to reliably pick up the data signal transmitted over the strip conductor 22 at the output side thereof in response to the clock signal transmitted over the strip conductor 21, it is necessary for the clock signal to be delayed by half the time duration of the data signal and so it is necessary for the clock signal transmitted over the strip conductor 21 to be delayed by 60 ps from the data signal transmitted over the strip conductor 22. This difference of 60 ps can be attained by setting the lengths of the strip conductors to 3 cm, setting the relative dielectric constant εr of the dielectric 23 just under the strip conductor 21 to, for example, 9.0 or 8.0, and setting the relative dielectric constant εr of the dielectric 24 just under the strip conductor 22 to, for example, 5.0 or 4.0. In this manner, the correct operation performance was obtained.

As compared with the area of 125 mm×120 mm of a conventional microstrip transmission line device shown in FIG. 2 providing the same performance as this embodiment, the area of the embodiment device shown in FIG. 3 is 80 mm×120 mm. The area was reduced by 36%.

In this embodiment, alumina composite is used as the dielectric. Other proper materials may be selected in accordance with the characteristics of signals to be transmitted and operation environments. Typical dielectrics and their relative dielectric constants (representative values) are TEFLON (2.4), glass epoxy (4.4–5.0), and alumina ceramic (9.0–10.0). The dielectric constant εr can therefore be set to a desired value in a relatively wide range. The relative dielectric constant εr is selected in accordance with the equation (1) so as to satisfy tpd suitable for a signal to be transmitted.

[2nd Embodiment]

In the first embodiment, the absolute delay time of the microstrip transmission line with the strip conductor 21 is longer than that of the microstrip transmission line with the strip conductor 22, and in order to reduce a difference between conductor lengths, the relative dielectric constant εr of the dielectric 23 between the strip conductor 21 and ground plane conductor 25 is made to be different from the relative dielectric constant εr of the dielectric 24 between the strip conductor 22 and ground plane conductor 25. Therefore, the characteristic impedances of these microstrip transmission lines are different.

Figure 5A:
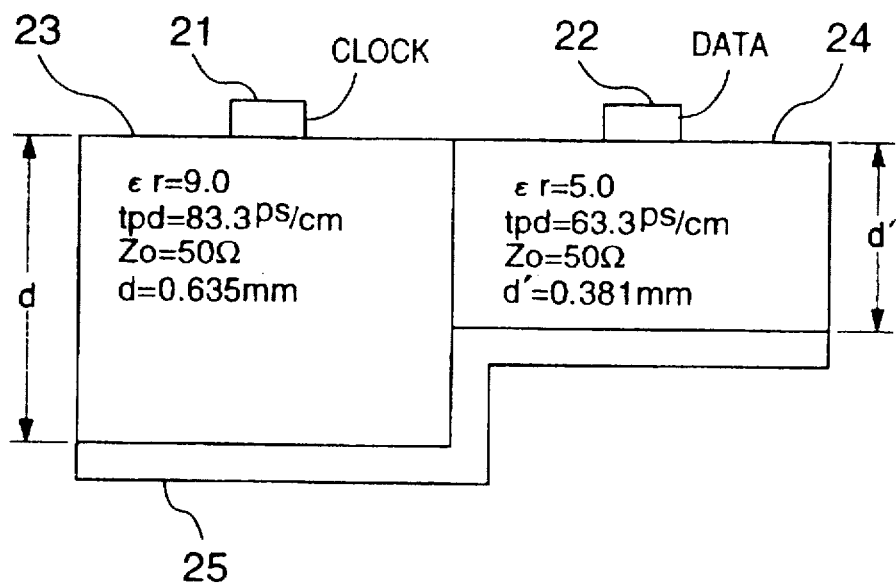
FIGS. 5A and 5B are cross sectional views of microstrip transmission line devices according to a second embodiment.
Figure 5B:
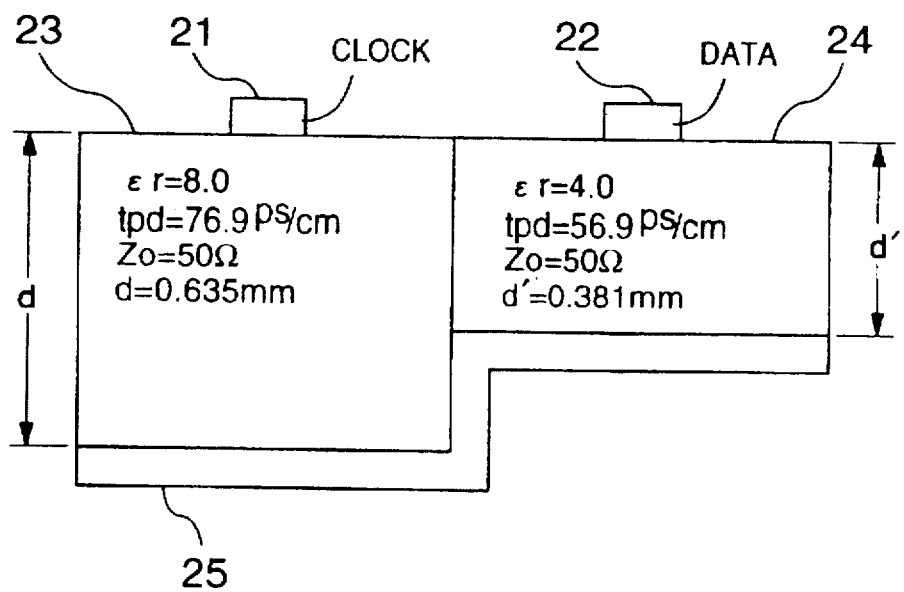

In this embodiment, a microstrip transmission line device having the characteristic impedances matched with each other will be described. FIGS. 5A and 5B are cross sectional views of microstrip transmission line devices.

(1) Structure of Microstrip Transmission Line Device

As shown in FIGS. 5A and 5B, the basic structures are the same as those shown in FIGS. 4A and 4B. The different points are only that the dielectric 24 just under the strip conductor 22 over which a data signal is transmitted, is made thin from 0.635 mm to 0.381 mm for impedance matching and that the cross section of the substrate conductor 25 is changed to a shape as shown.

As the equation (3) indicates, the characteristic impedance $Z_0$ is proportional to the distance d between the strip conductor and ground plate conductor and inversely proportional to the width W of the strip conductor (also inversely proportional of a relative dielectric constant εr of the dielectric). In this embodiment, without changing the width W of the strip conductor, the thickness of the dielectric 24 is adjusted to match the characteristic impedances $Z_0$ of the microstrip transmission lines.

From the equations (2) and (3), the characteristic impedance $Z_0$ of the microstrip transmission line constituted by the strip conductor 21, dielectric 23, and ground plane conductor 25 is 50Ω. In order to make this impedance 50Ω match the characteristic impedance $Z_0$ of the microstrip transmission line constituted by the strip conductor 22, dielectric 24, and ground plane conductor 25, it is necessary to compensate for the difference between relative dielectric constants of both the dielectric substances. This difference (9.0–5.0= 4.0 or 8.0–4.0=4.0) can be compensated for by adjusting the distance d between the strip conductor 22 and ground plane conductor 25, i.e., the thickness of the dielectric 24, from 0.635 mm to 0.381 mm, so that the characteristic impedance $Z_0$ of this microstrip transmission line is set to 50Ω.

(2) Manufacturing Method

The microstrip transmission line device was manufactured basically by the manufacturing steps of the first embodiment, excepting that copper plating was performed instead of rolling and attaching the ground plate conductor 25 because the dielectric 24 only was to be thinned.

(3) Performance Test Results

The same signals as the first embodiment were used (clock signal transmitting over the strip conductor 21 with tpd=83.3 ps/cm or 76.9 ps/cm, and data signal transmitting over the strip conductor 22 with tpd=63.3 ps/cm or 56.9 ps/cm). The performance was improved more than the first embodiment, the signal transmission loss was considerably reduced, and the transmission efficiency was improved, because of the matched characteristic impedances $Z_0$ of the microstrip transmission lines.

[3rd Embodiment]

Similar the second embodiment, a difference of the characteristic impedance between two microstrip transmission lines, to be caused by different relative dielectric constants of the dielectrics 23 and 24 of the first embodiment, is compensated for by making the characteristic impedances match with each other. Instead of adjusting the distance d as in the second embodiment, the width W of the strip conductor is adjusted in this embodiment to make the characteristic impedances match with each other. An example of a microstrip transmission line device of this embodiment will be described with reference to FIGS. 6A and 6B which are cross sectional views of microstrip transmission line devices.

(1) Structure of Microstrip Transmission Line Device

Figure 6A:
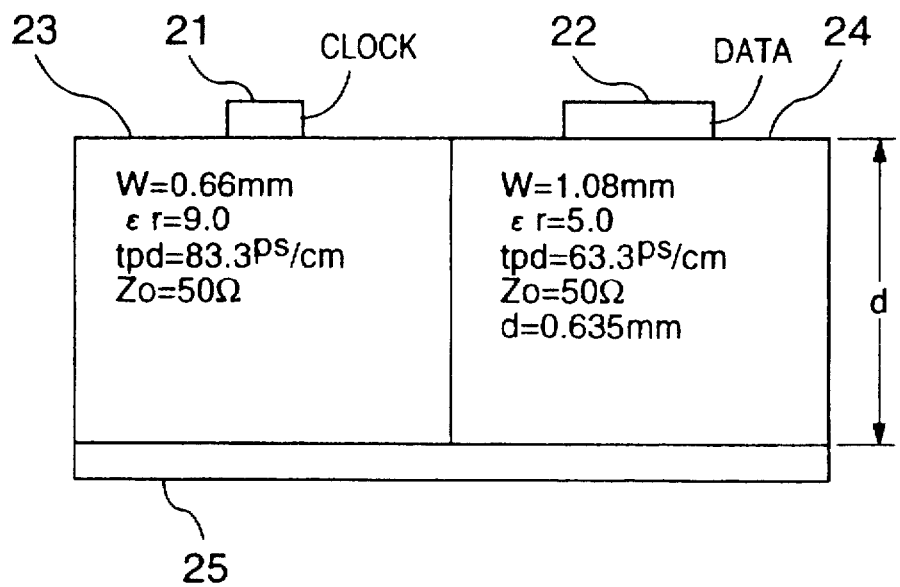
FIGS. 6A and 6B are cross sectional views of microstrip transmission line devices according to a third embodiment.
Figure 6B:
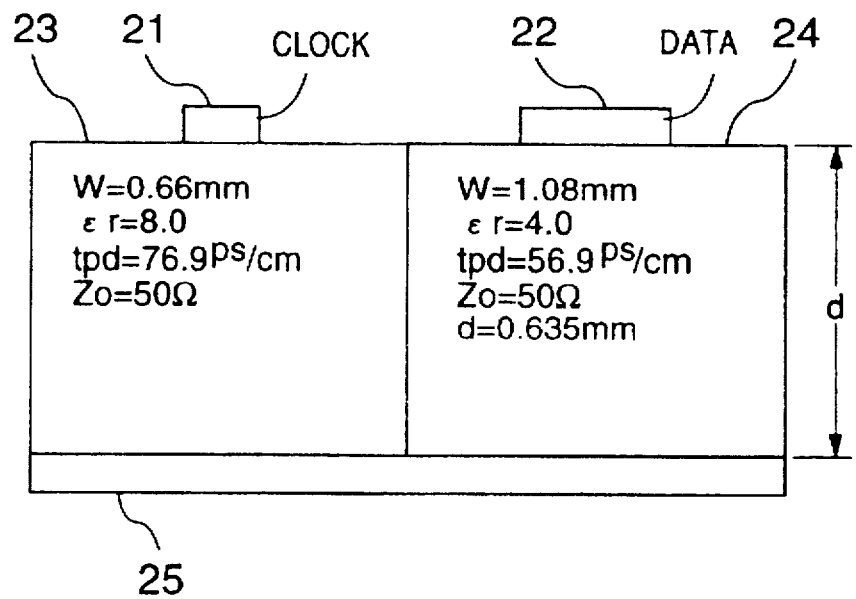

As shown in FIGS. 6A and 6B, the basic structures are the same as those of the first embodiment shown in FIGS. 4A and 4B. The different point is only that the width W of the strip conductor 22 over which a data signal is transmitted, is made wider from 0.66 mm to 1.08 mm for impedance matching.

As the equation (3) indicates, the characteristic impedance $Z_0$ is proportional to the distance d between the strip conductor and ground plate conductor and inversely proportional to the width W of the strip conductor (also inversely proportional of a relative dielectric constant $\varepsilon r$ of the dielectric). In this embodiment, without changing the thickness d of the dielectric 24, the width W of the strip conductor 22 is adjusted to match the characteristic impedances $Z_0$ of the microstrip transmission lines.

From the equations (2) and (3), the characteristic impedance $Z_0$ of the microstrip transmission line constituted by the strip conductor 21, dielectric 23, and ground plane conductor 25 is 50Ω. In order to make this impedance 50Ω match the characteristic impedance $Z_0$ of the microstrip transmission line constituted by the strip conductor 22, dielectric 24, and ground plane conductor 25, it is necessary to compensate for the difference between relative dielectric constants of both the dielectrics. This difference (9.0−5.0=4.0 or 8.0−4.0=4.0) can be compensated for by adjusting the width W of the strip conductor 22 from 0.66 mm to 1.08 mm, so that the characteristic impedance $Z_0$ of this microstrip transmission line is set to 50Ω.

(2) Manufacturing Method

The microstrip transmission line device was manufactured basically by the manufacturing steps of the first embodiment, excepting that as shown in FIGS. 6A and 6B the pattern width of a photoresist mask for only the strip conductor 22 was made wider to form the strip conductor 22 having a width of 1.08 mm. The width of the other strip conductor 21 was fixed to 0.66 mm same as the first embodiment.

(3) Performance Test Results

The same signals as the first embodiment were used (clock signal transmitting over the strip conductor 21 with tpd=83.3 ps/cm or 76.9 ps/cm, and data signal transmitting over the strip conductor 22 with tpd=63.3 ps/cm or 56.9 ps/cm). The performance was improved more than the first embodiment, the signal transmission loss was considerably reduced, and the transmission efficiency was improved, because of the matched characteristic impedances $Z_0$ of the microstrip transmission lines.

[4th Embodiment]

Figure 7A:
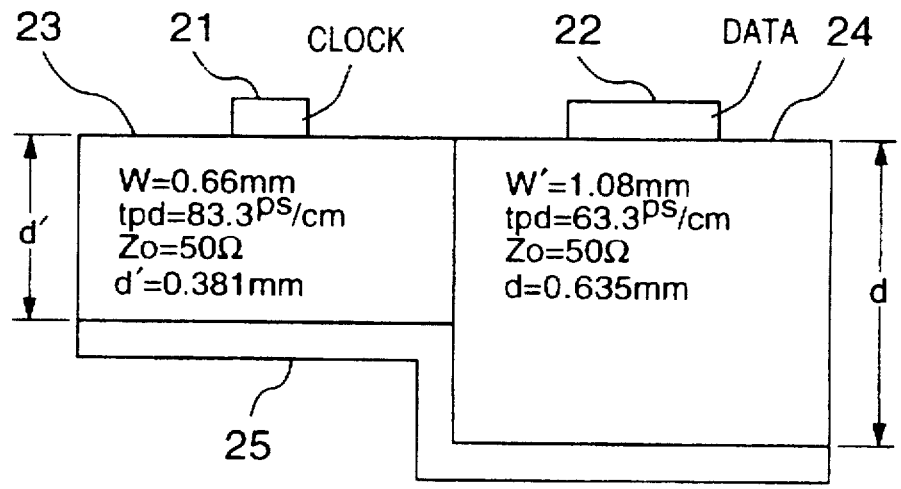
FIGS. 7A and 7B are cross sectional views of microstrip transmission line devices according to a fourth embodiment.
Figure 7B:
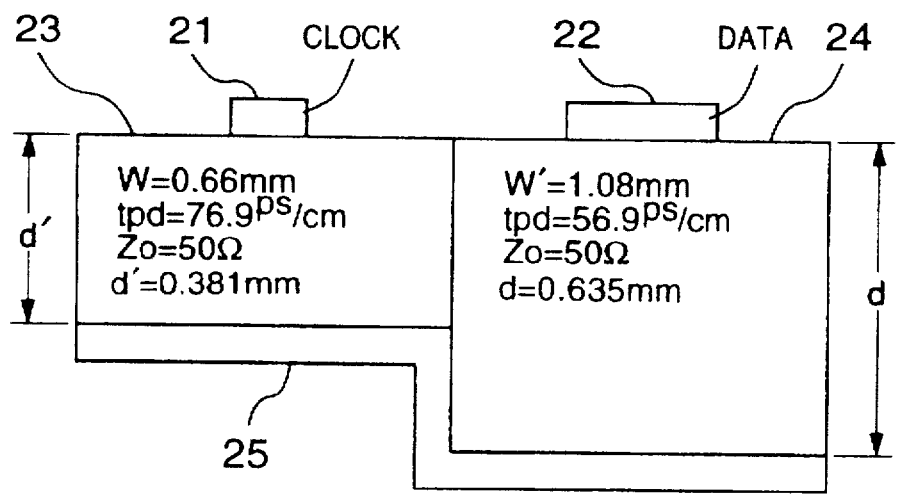

Also in this embodiment, the characteristic impedances $Z_0$ are matched with each other. Matching is realized by a combination of adjustment of the distance d between the strip conductor and ground plane conductor of the second embodiment and adjustment of the width W of the strip conductor of the third embodiment. FIGS. 7A and 7B are cross sectional views showing examples of microstrip transmission line devices of this embodiment.

As shown, in order to match the characteristic impedances $Z_0$ of the microstrip transmission lines, the widths W and W' of the strip conductors 21 and 22 and the distances d' and d between the strip conductor 21 and ground plane conductor 25 and between the strip conductor 22 and ground plane conductor 25 are set to predetermined values. In this manner, the absolute delay times of the microstrip transmission line with the strip conductor 21 and the microstrip transmission line with the strip conductor 22 can be set so as to satisfy the specifications of absolute delay times, and also the characteristic impedances $Z_0$ of the microstrip transmission line with the strip conductor 21 and the microstrip transmission line with the strip conductor 22 can be matched with each other.

The structure of the microstrip transmission line device and signals to the transmitted over the strip conductors are the same as the first embodiment, excepting that the width of one strip conductor and the thickness of one dielectric are changed to have predetermined values. Specifically, the width W of the strip conductor 21 is 0.66 mm and the width W' of the strip conductor 22 is 0.381, which are the same as the third embodiment shown in FIGS. 6A and 6B. The thickness d of the dielectric 23 is 0.381 mm, and the thickness d' of the dielectric 24 is 0.635 mm. This embodiment has the same advantageous effects as the first embodiment. In addition, since the characteristic impedances $Z_0$ of both the microstrip transmission lines are matched with each other at 50Ω, a microstrip transmission line device with a low transmission loss can be realized.

[5th Embodiment]

Figure 8:
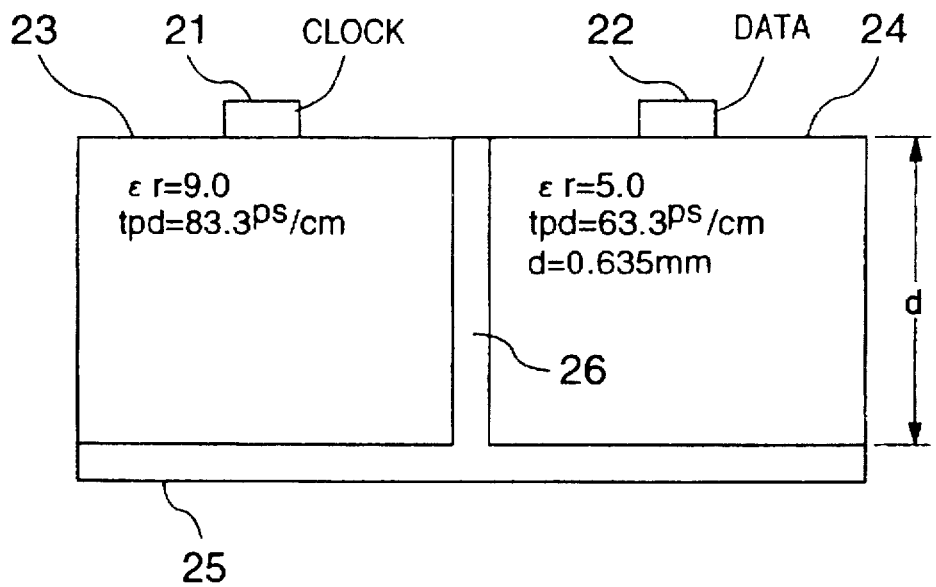
FIG. 8 is a cross sectional view of a microstrip transmission line device according to a fifth embodiment.

In this embodiment, an example of the structure for reducing crosstalk between adjacent microstrip transmission lines will be described. FIG. 8 is a cross sectional view of a microstrip transmission line device. A problem of crosstalk arises if the number of strip conductors becomes large and a distance between congested adjacent strip conductors becomes too short. To solve the crosstalk problem, an electromagnetic shield layer 26 connected to a ground plane conductor 25 separates a dielectric 23 and dielectric 24 of two microstrip transmission lines one being constituted by a strip conductor 21, the dielectric 23, and the ground plane conductor 25 and the other being constituted by a strip conductor 22, the dielectric 24, and the ground plane conductor 25. With this structure, the electric field in the dielectric generated by one microstrip transmission line will not reach the dielectric of the other microstrip transmission line. This structure has therefore an electric field shielding effect and can reduce a crosstalk amount between the microstrip transmission lines.

In this embodiment, copper foil same as the material of the ground plane conductor 25 is inserted between the dielectrics 23 and 24 as the electromagnetic shield layer 26. If conductive adhesive such as silver paste is used in place of the copper foil, the conductive adhesive functions both as a bonding material between the two dielectrics and as electromagnetic shielding.

[6th Embodiment]

Figure 9:
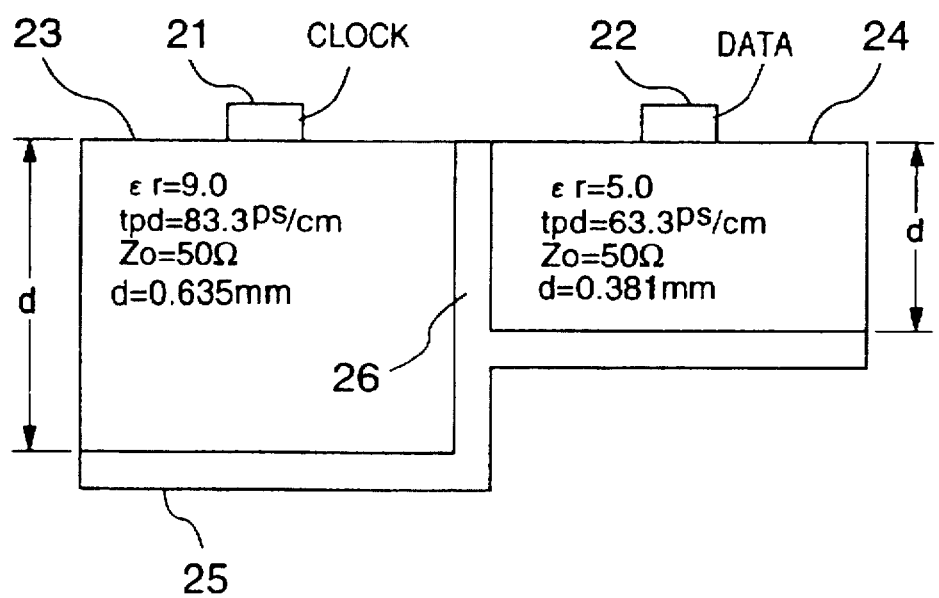
FIG. 9 is a cross sectional view of a microstrip transmission line device according to a sixth embodiment.

In this embodiment, similar to the fifth embodiment, an example of the structure for reducing crosstalk between adjacent microstrip transmission lines will be described. FIG. 9 is a cross sectional view of a microstrip transmission line device. As shown, the structure is basically the same as the second embodiment shown in FIG. 5A, excepting that an electromagnetic shield layer 26 is interposed between the dielectrics.

With this structure, the electric field in the dielectric generated by one microstrip transmission line will not reach the dielectric of the other microstrip transmission line. This structure has therefore an electric field shielding effect and can reduce a crosstalk amount between the microstrip transmission lines.

[7th Embodiment]

Figure 10:
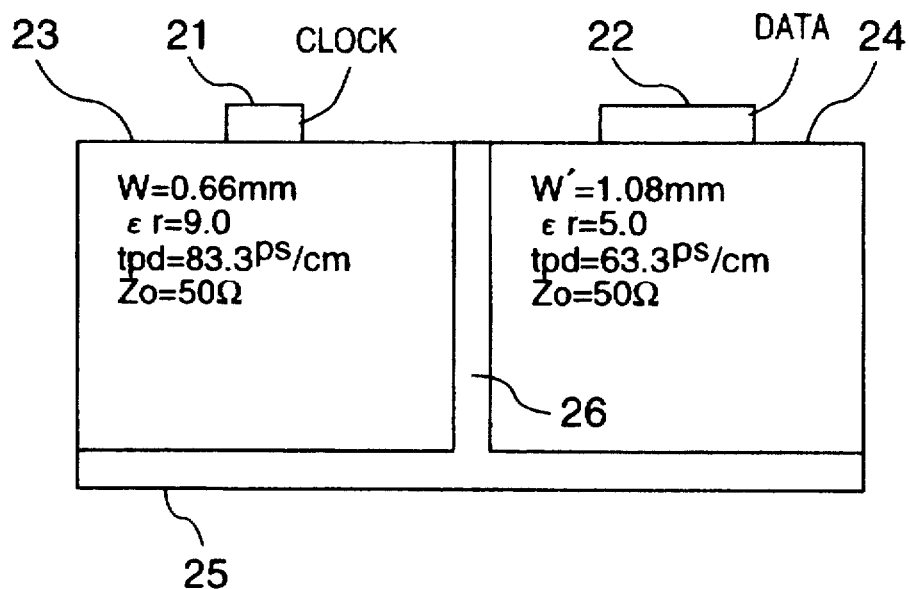
FIG. 10 is a cross sectional view of a microstrip transmission line device according to a seventh embodiment.

In this embodiment, similar to the fifth embodiment, an example of the structure for reducing crosstalk between adjacent microstrip transmission lines will be described. FIG. 10 is a cross sectional view of a microstrip transmission line device. As shown, the structure is basically the same as the third embodiment shown in FIG. 6A, excepting that an electromagnetic shield layer 26 is interposed between the dielectrics.

With this structure, the electric field in the dielectric generated by one microstrip transmission line will not reach the dielectric of the other microstrip transmission line. This structure has therefore an electric field shielding effect and can reduce a crosstalk amount between the microstrip transmission lines.

[8th Embodiment]

Figure 11:
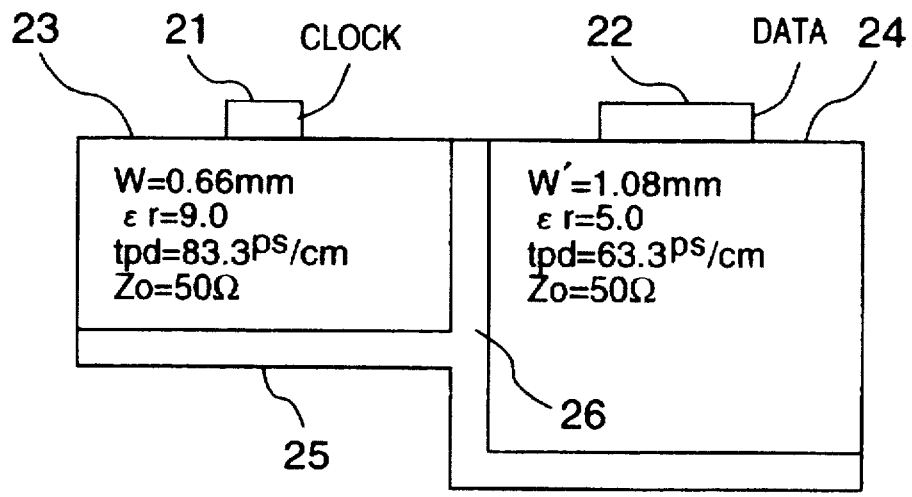
FIG. 11 is a cross sectional view of a microstrip transmission line device according to an eighth embodiment.

In this embodiment, similar to the fifth embodiment, an example of the structure for reducing crosstalk between adjacent microstrip transmission lines will be described. FIG. 11 is a cross sectional view of a microstrip transmission line device. As shown, the structure is basically the same as the third embodiment shown in FIGS. 7A, excepting that an electromagnetic shield layer 26 is interposed between the dielectrics.

With this structure, the electric field in the dielectric generated by one microstrip transmission line will not reach the dielectric of the other microstrip transmission line. This structure has therefore an electric field shielding effect and can reduce a crosstalk amount between the microstrip transmission lines.

[9th Embodiment]

Figure 13:
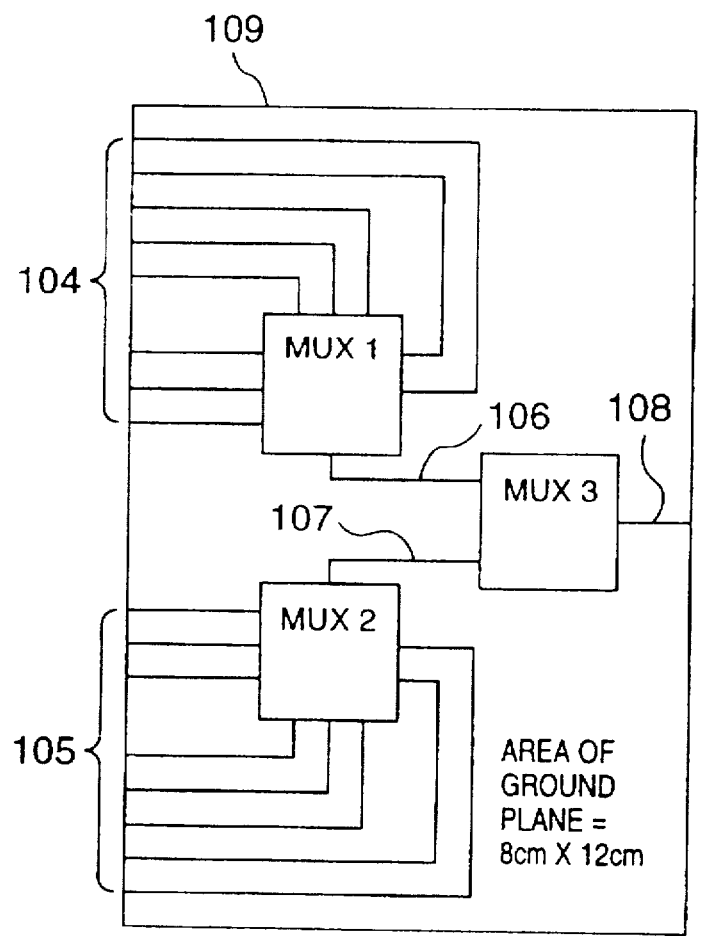
FIG. 13 is a schematic plan view of a comparison example of a multiplexer circuit module using a microstrip transmission line device according to a ninth embodiment.

FIG. 13 is a schematic plan view of a microstrip transmission line module with multiplexers according to the ninth embodiment of the invention. This module is constituted by circuit elements including 8:1 multiplexer ICs (MUX1 and MUX2) and a 2:1 multiplexer IC (MUX3), a ground plane conductor 109, and microstrip transmission lines 106, 107, 108, 104, and 105.

In this microstrip transmission line module, eight data signals are inputted via the microstrip transmission lines 104 to eight input terminals of the 8:1 multiplexer IC (MUX1), and via the microstrip transmission lines 105 to eight input terminals of the 8:1 multiplexer IC (MUX2) to multiplex the data signals. The multiplexed data signals are inputted via the microstrip transmission lines 106 and 107 to two input terminals of the 2:1 multiplexer IC (MUX3) to further multiplex the multiplexed data signals. The data signal multiplexed at a ratio of 16:1 is then outputted to the microstrip transmission line 108.

Figure 12:
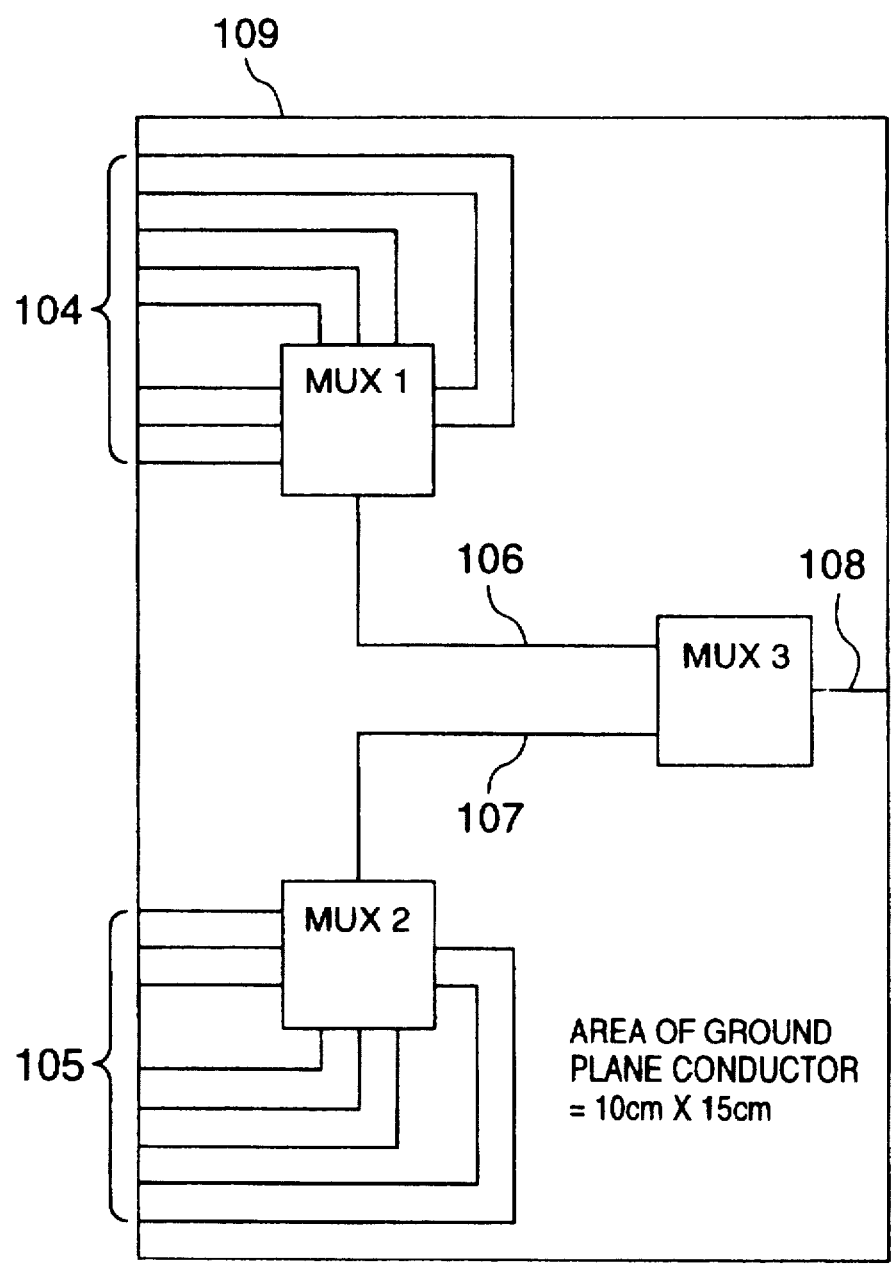
FIG. 12 is a schematic plan view of a comparison example of a multiplexer circuit module using a conventional microstrip transmission line device.

FIG. 12 is a plan view showing a comparison example of a microstrip transmission line module with multiplexers having the same function as the module shown in FIG. 13. Similar to the module shown in FIG. 13, the module shown in FIG. 12 is constituted by circuit elements including 8:1 multiplexer ICs (MUX1 and MUX2) and a 2:1 multiplexer IC (MUX3), a ground plane conductor 109, and microstrip transmission lines 106, 107, 108, 104, and 105.

In this microstrip transmission line module shown in FIG. 12, data signals multiplexed by the 8:1 multiplexer ICs (MUX1 and MUX2) are inputted via the microstrip transmission lines to two input terminals of the 2:1 multiplexer IC (MUX3). The input timings of the multiplexed data signals to the 2:1 multiplexer IC (MUX3) are adjusted by the lengths of the microstrip transmission lines 106 and 107. Depending upon the timing specification, the lengths of the microstrip transmission lines 106 and 107 may become long. In such a case, the circuit elements including the 8:1 multiplexer ICs (MUX1 and MUX2) and the 2:1 multiplexer IC (MUX3) may have no degree of freedom in their layout so that the size of the ground plane conductor 109 cannot be reduced. The comparison example shown in FIG. 12 has the ground plane conductor whose size is 10 cm×15 cm. This is because the dielectric substance on the ground plane conductor 109 is the same over the whole area of the ground plane conductor 109, i.e., the dielectric constituting the microstrip transmission line and having a relative dielectric constant ($\varepsilon r=2.2$) is the same over the whole area of the ground plane conductor 109.

In the embodiment shown in FIG. 13, in order to shorten the microstrip transmission lines 106 and 107 more than those shown in FIG. 12 and make the delay times of the microstrip transmission lines 106 and 107 have the same values as those shown in FIG. 12, the relative dielectric constant of the dielectric between the strip conductors and ground plane conductor constituting the microstrip transmission lines 106 and 107 is set larger than that of the dielectric between the strip conductors and ground plane conductor constituting the microstrip transmission lines 106 and 107 shown in FIG. 12 ($\varepsilon r=10.0$).

Specifically, in the comparison example shown in FIG. 12, the lengths of the microstrip transmission lines 106 and 107 are 6 cm, the dielectric is alumina composite having a relative dielectric constant $\varepsilon r$ of 2.2 and tpd of 44.8 ps/cm. The necessary delay times of the microstrip transmission lines 106 and 107 are 268.8 ps. In contrast, in the embodiment shown in FIG. 13, the dielectric only just under the microstrip transmission lines 106 and 107 has a relative dielectric constant $\varepsilon r$ of 10.0 and tpd of 89.6 ps/cm. Therefore, the same delay time of 268.8 ps can be obtained by using the microstrip transmission lines 106 and 107 of 3 cm long and the size of the ground plate conductor 109 can be reduced to 8 cm×12 cm which is smaller by 30.7% than the comparison module shown in FIG. 12.

Similar to the second to fourth embodiments, the width of the strip conductor, the distance between the strip conductor and ground plane conductor, or both of them may be adjusted to have predetermined values. In this case, the characteristic impedances of the microstrip transmission lines 106 and 107 can be matched with each other, the absolute delay times thereof can be set so as to satisfy the specification, and the lengths thereof can be shortened.

In this embodiment where the number of congested microstrip transmission lines becomes large and a sufficient gap between lines cannot be ensured, the problem of crosstalk may occur. To avoid this, similar to the fifth to eighth embodiments, an electromagnetic shield layer may be inserted between adjacent dielectrics. With this structure, the electric field in the dielectric generated by one microstrip transmission line will not reach the dielectric of the other microstrip transmission line. This structure has therefore an electric field shielding effect and can reduce a crosstalk amount between the microstrip transmission lines.

[10th Embodiment]

In this embodiment, a microstrip transmission line of a microstrip transmission line device is made replaceable in accordance with the characteristics of a signal to be transmitted. The embodiment will be described with reference to FIGS. 14, 15, 16A and 16B, and 17A and 17B.

Figure 14:
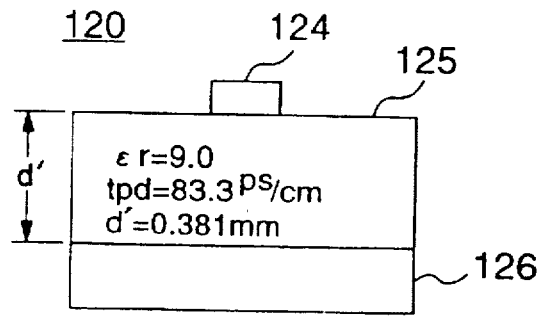
FIG. 14 is a cross sectional view of a microstrip transmission line component according to a tenth embodiment.
Figure 15:
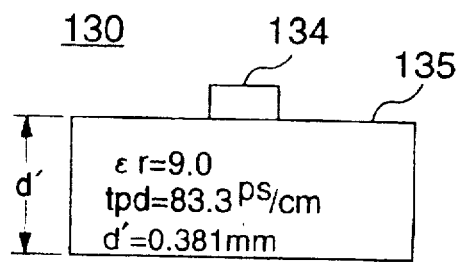
FIG. 15 is a cross sectional view of another microstrip transmission line component according to the tenth embodiment.

FIGS. 14 and 15 are cross sectional views of microstrip transmission line components having different structures for replacement. FIGS. 16A and 16B, and 17A and 17B are cross sectional views of microstrip transmission line devices having different structures on which the microstrip transmission line components shown in FIGS. 14 and 15 are mounted.

The structures of the microstrip transmission line components shown in FIGS. 14 and 15 will be described first. A microstrip transmission line component 120 shown in FIG. 14 is constituted by a strip conductor 124, a dielectric 125, and a ground plane conductor 126. The strip conductor 124 has a width of 0.66 mm, a thickness of 18 μm, and a length of 3 cm. The dielectric 125 is made of alumina composite having a relative dielectric constant εr of 9.0. The ground plane conductor 126 is made of copper having a thickness of 0.254 mm. The signal delay time specification of tpd=83.3 ps/cm can thus be satisfied.

A microstrip transmission line component 130 shown in FIG. 15 is constituted by a strip conductor 134 and a dielectric 135. The strip conductor 134 has a width of 0.66 mm, a thickness of 18 μm, and a length of 3 cm. The dielectric 135 is made of alumina composite having a relative dielectric constant εr of 9.0. The signal delay time specification of tpd=83.3 ps/cm can thus be satisfied.

Figure 16A:
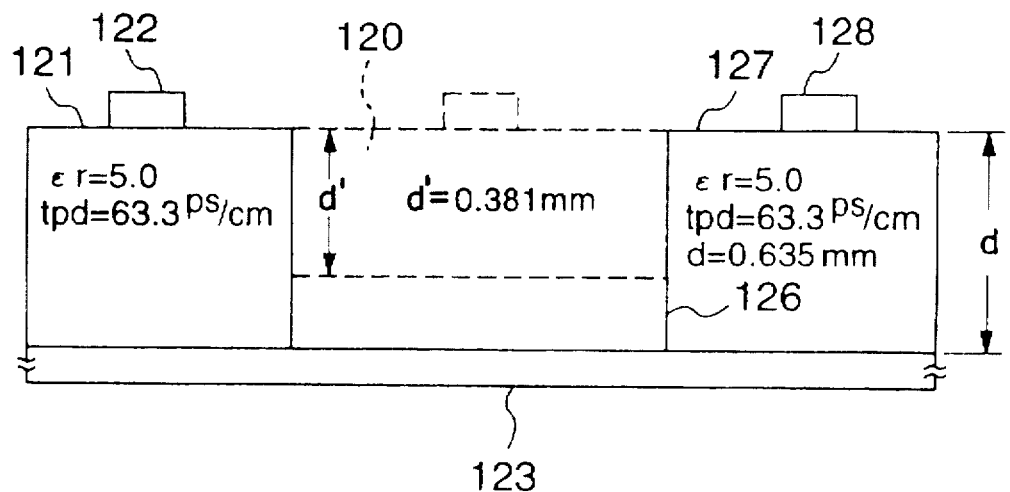
FIGS. 16A and 16B are cross sectional views of a microstrip transmission line device before and after the microstrip transmission line component shown in FIG. 14 is mounted.

FIG. 16A is a cross sectional view showing a microstrip transmission line device before the microstrip transmission line component 120 shown in FIG. 14 is mounted. As shown, on a ground plane conductor 123 made of copper having a thickness of 1 mm, excepting the area where the microstrip transmission line component 120 is mounted, dielectrics 121 and 127 are adhered. The dielectrics 121 and 127 are made of alumina composite having a thickness of 0.635 mm and a relative dielectric constant εr of 5.0. On the dielectrics 121 and 127, strip conductors 122 and 128 are formed which are made of copper having a width of 0.66 mm, a thickness of 18 μm, and a length of 3 cm. These microstrip transmission lines satisfy the delay times tpd of 63.3 ps/cm.

Figure 16B:
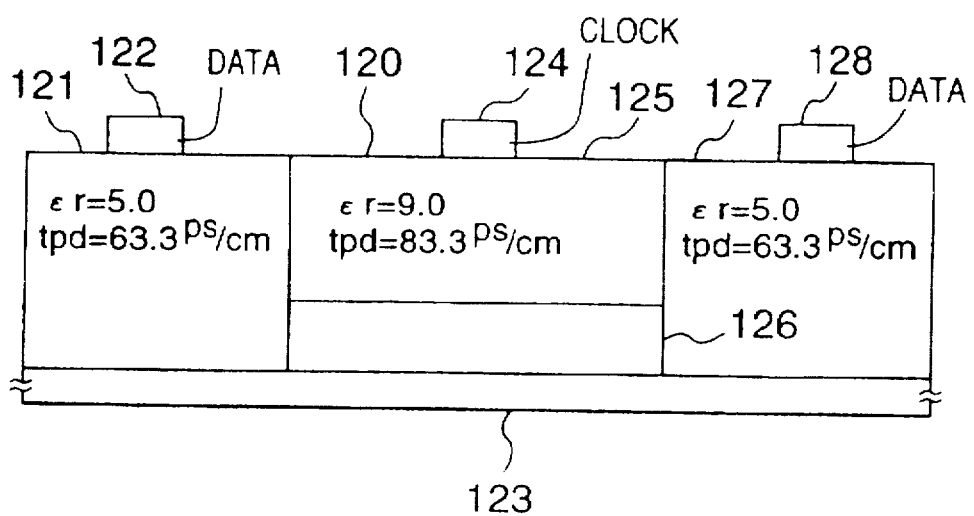

FIG. 16B shows the microstrip transmission line device on which the microstrip transmission line component 120 shown in FIG. 14 is mounted. Signals to be transmitted over the strip conductors 122 and 128 are data signals, and a signal to be transmitted over the strip conductor 124 is a clock signal. The length of each strip conductor is 3 cm, and the time duration of the data signal and the period of the clock signal are 120 ps.

The rise timings of the data signal inputted to the strip conductors 122 and 128 and the clock signal inputted to the strip conductor 124 are the same. In order to reliably pick up the data signals transmitted over the strip conductors 122 and 128 at the output side thereof in response to the clock signal transmitted over the strip conductor 124, it is necessary for the clock signal to be delayed by half the time duration of the data signal and so it is necessary for the clock signal transmitted over the strip conductor 124 to be delayed by 60 ps from the data signals transmitted over the strip conductors 122 and 128. This difference of 60 ps can be attained by setting the lengths of the strip conductors to 3 cm, setting the relative dielectric constant εr of the dielectric 125 just under the strip conductor 124 to 9.0, and setting the relative dielectric constants εr of the dielectrics 121 and 127 just under the strip conductors 122 and 128 to 5.0.

Figure 17A:
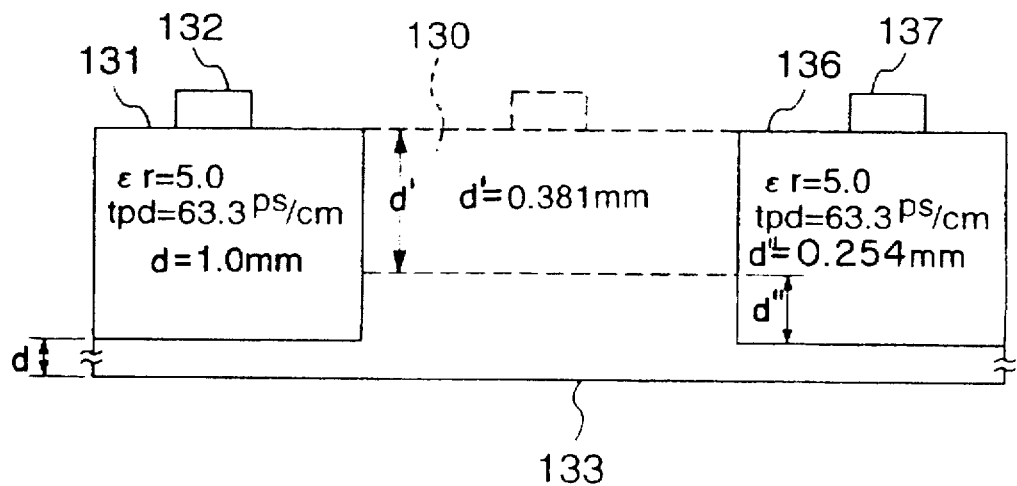
FIGS. 17A and 17B are cross sectional views of a microstrip transmission line device before and after the microstrip transmission line component shown in FIG. 15 is mounted.

FIG. 17A is a cross sectional view showing a microstrip transmission line device before the microstrip transmission line component 130 shown in FIG. 15 is mounted. As shown, on a ground plane conductor 133 made of copper having a thickness of 1 mm, excepting the area where the microstrip transmission line component 130 is mounted, dielectrics 131 and 136 are adhered. The dielectrics 131 and 136 are made of alumina composite having a thickness of 0.635 mm and a relative dielectric constant εr of 5.0. On the dielectrics 131 and 136, strip conductors 132 and 137 are formed which are made of copper having a width of 0.66 mm, a thickness of 18 μm, and a length of 3 cm.

The thickness of the ground plane substrate 133 is 1.254 mm partially thicker than other areas, at the area where the microstrip transmission line component 130 is mounted. Therefore, when the microstrip transmission line component is mounted, the upper surfaces of the dielectrics are made flush with each other. These microstrip transmission lines satisfy the delay times tpd of 63.3 ps/cm.

Figure 17B:
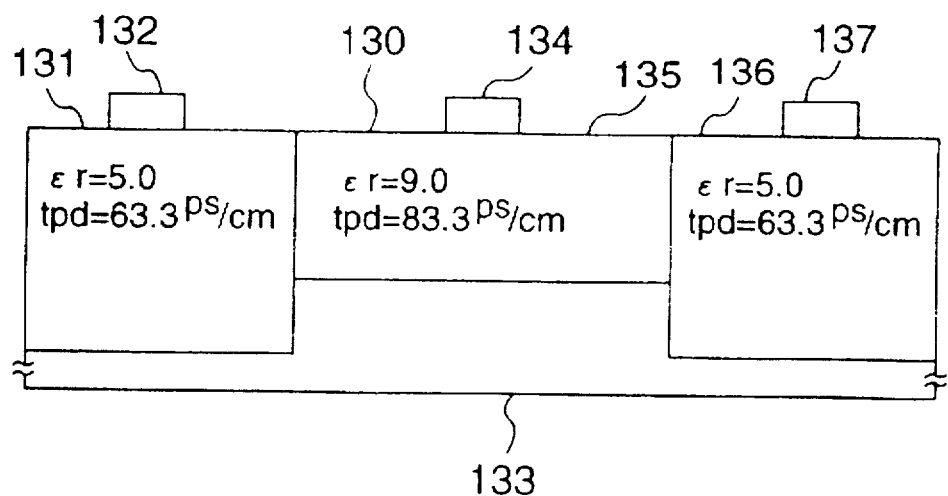

FIG. 17B shows the microstrip transmission line device on which the microstrip transmission line component 130 shown in FIG. 15 is mounted. Signals to be transmitted over the strip conductors 132 and 137 are data signals, and a signal to be transmitted over the strip conductor 134 is a clock signal. The other operation characteristics are the same as those described with FIGS. 16A and 16B, and the description thereof is omitted.

In this embodiment, the thicknesses of the dielectrics of the microstrip transmission line components are made thinner than all the adjacent dielectrics shown in FIGS. 16A and 16B, and FIGS. 17A and 17B. As already described with FIGS. 5A and 5B, a difference between the characteristic impedances caused by different relative dielectric constants of dielectrics at particular microstrip transmission lines is compensated for basing upon the equation (3) for impedance matching. It is obvious that in order to relieve the crosstalk problem between adjacent microstrip transmission lines, an electromagnetic shield layer is inserted between adjacent dielectrics in the same manner illustrated in FIG. 8 of the fifth embodiment.

In this embodiment, the microstrip transmission line component is made partially replaceable. Therefore, even if a high precision delay time is necessary, the delay time at a desired microstrip transmission line section can be adjusted by replacing the component after the manufacture of the microstrip transmission line device. Accordingly, the cost of design and manufacture can be reduced.

As described in detail, the objects of the invention have thus been achieved. Specifically, even if there is a difference between transmission delay times of a plurality of microstrip transmission lines interconnecting high speed digital circuit elements, a difference between line lengths can be shortened so that a layout of high speed digital circuit elements becomes easy.

Also in this case, the characteristic impedances of a plurality of microstrip transmission lines interconnecting high speed digital circuit elements can be adjusted as desired. Accordingly, impedance matching is possible between microstrip transmission lines and between microstrip transmission lines and high speed digital circuit elements.

Even if there are a number of microstrip transmission lines interconnecting high speed digital circuit elements and a sufficient gap between congested microstrip transmission lines cannot be attained, crosstalk can be reduced.

Since a degree of freedom in the layout of microstrip transmission lines becomes large, the size of a microstrip transmission line module with digital circuit elements being mounted thereon can be made small.

Since a microstrip transmission line component is made replaceable, redesign and manufacture of a microstrip transmission line device can be dispensed with.

What is claimed is:

1. A method of manufacturing a microstrip transmission line device, comprising the steps of:

providing a dielectric substrate having a first portion of a first dielectric having a first thickness and a first dielectric constant and a second portion of a second dielectric having a second thickness and a second dielectric constant different from the first dielectric constant, the first and second portions being in contact with each other;

forming a ground plane conductor on one face of the dielectric substrate so as to contact said first and second dielectric portions;

forming a first strip conductor having a first width upon another face of the dielectric substrate which is in contact with said first portion, wherein said another face of the dielectric substrate lies in a plane substantially parallel to a plane defined by said one face of the dielectric substrate, and wherein a clock signal is transmitted over the first strip conductor; and forming a second strip conductor having a second width upon said another face of the dielectric substrate which is in contact with said second portion, the second strip conductor being substantially parallel to the first strip conductor, wherein a data signal is transmitted over the second strip conductor;

wherein values of the first and second dielectric constants are determined according to absolute transmission delay times of signals to be transmitted over the first and second strip conductors, and wherein a characteristic impedance of the first strip conductor is matched with a characteristic impedance of the second strip conductor by varying values of the first and second thicknesses and values of the first and second widths.

2. The method according to claim 1, further comprising the step of providing an electromagnetic shield layer between the first portion and the second portion of the the dielectric substrate to reduce crosstalk between the clock signal and the data signal.

* * * * *